US006881678B2

(12) United States Patent
Lee (10) Patent No.: US 6,881,678 B2
(45) Date of Patent: Apr. 19, 2005

(54) METHOD FOR FORMING A DUAL DAMASCENE STRUCTURE IN A SEMICONDUCTOR DEVICE

(75) Inventor: Dae Gun Lee, Bucheon-si (KR)

(73) Assignee: Anam Semiconductor, Inc., Seoul (KR)

( * ) Notice: Subject to any disclaimer, the term of this patent is extended or adjusted under 35 U.S.C. 154(b) by 0 days.

(21) Appl. No.: 10/751,169

(22) Filed: Dec. 30, 2003

(65) Prior Publication Data

US 2004/0157437 A1 Aug. 12, 2004

(30) Foreign Application Priority Data

Dec. 30, 2002 (KR) .............................. 10-2002-0086736

(51) Int. Cl.[7] ...................... H01L 21/302; H01L 21/461
(52) U.S. Cl. ...................................... 438/740; 438/700
(58) Field of Search ............................... 438/740, 680, 438/706, 712, 700, 745

(56) References Cited

U.S. PATENT DOCUMENTS 6,383,919 B1 * 5/2002 Wang et al. ................ 438/638
6,457,477 B1 * 10/2002 Young et al. ................ 134/1.2
6,743,713 B1 * 6/2004 Mukherjee-Roy et al. .. 438/638
6,797,633 B1 * 9/2004 Jiang et al. ................ 438/706

* cited by examiner

Primary Examiner—David Nhu
(74) Attorney, Agent, or Firm—Andrew D. Fortney

(57) ABSTRACT

In a method for forming a dual damascene structure in a semiconductor device, an insulating layer is formed on a semiconductor substrate and a silicon nitride etch stop layer is formed on the insulating layer. Then a photoresist layer is applied on the etch stop layer for a contact hole pattern. Thereafter, the insulating layer is etched according to the contact hole pattern and the rest etch stop layer is pull back etched to expose upper surface of the insulating layer. The insulating layer is etched again according to the modified pattern of the rest etch stop layer and the rest etch stop layer is removed so that a dual damascene structure is completed. Therefore, a dual damascene structure can be made by using a single photoresist process and a single etch stop layer so that a manufacturing process is simplified.

5 Claims, 8 Drawing Sheets

METHOD FOR FORMING A DUAL DAMASCENE STRUCTURE IN A SEMICONDUCTOR DEVICE

FIELD OF THE INVENTION

The present invention relates to a method for manufacturing a semiconductor device; and, more particularly, to a method for forming a dual damascene structure in a semiconductor device.

BACKGROUND OF THE INVENTION

As an integration of a semiconductor device goes on, a research on a capability enhancement of the semiconductor device as well as down sizing thereof is performed at the same time. At present, most wiring structure of the semiconductor device adopts a multi-layer wiring structure. The multi-layer wiring structure may overcome problems on signal transmission speed that are generated during an operation of highly integrated device. And with an advent of the multi-layer wiring structure, a dual damascene process is highlighted due to its simplicity. The dual damascene process is composed of the steps of forming a contact hole and a trench in an insulating layer, performing a gap-fill on a conductive film, and performing a chemical mechanical polishing to thereby form a wiring and a contact hole at the same time.

There are several methods for forming a dual damascene structure in a semiconductor device. One of a conventional methods is shown in FIGS. 1A to 1D. Two photolithographic processes and two insulator layers separated by an etch stop layer are employed to achieve the shown structure as follows. In this method, the dual damascene structure is formed by a way that a trench is first formed and then a contact hole is formed in an insulating layer later.

Figure 1A:
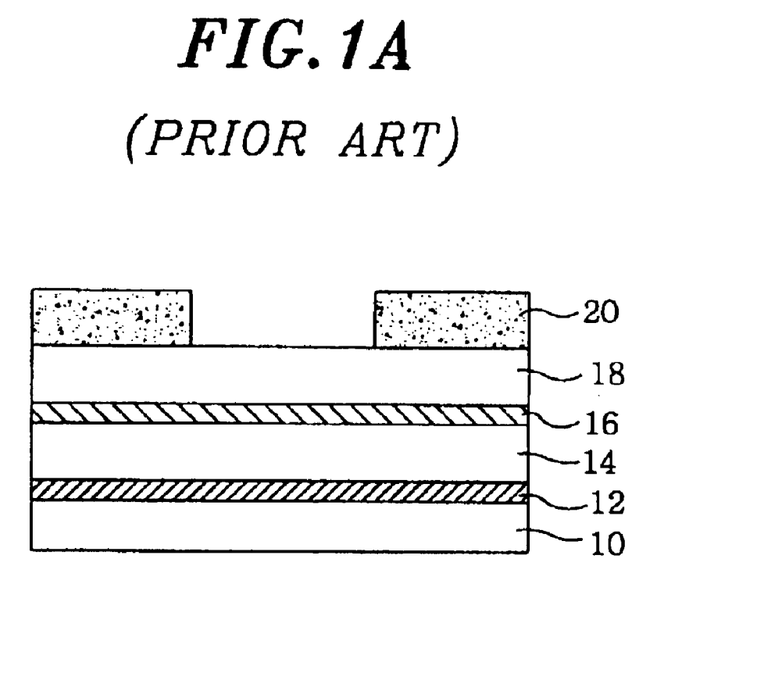
FIGS. 1A to 1D show a sequence of a conventional method for forming a dual damascene structure in a semiconductor device.

As shown in FIG. 1A, a semiconductor substrate 10 is provided with a semiconductor device (not shown) therein. Thereafter, a first etch stop layer 12 is applied on the semiconductor substrate 10. And then, a first insulating layer 14, a second etch stop layer 16 and a second insulating layer 18 are deposited on the first etch stop layer 12 sequentially. And then, a first photoresist pattern 20 for defining the trench is formed on the second insulating layer 18 by a photolithography process.

Figure 1B:
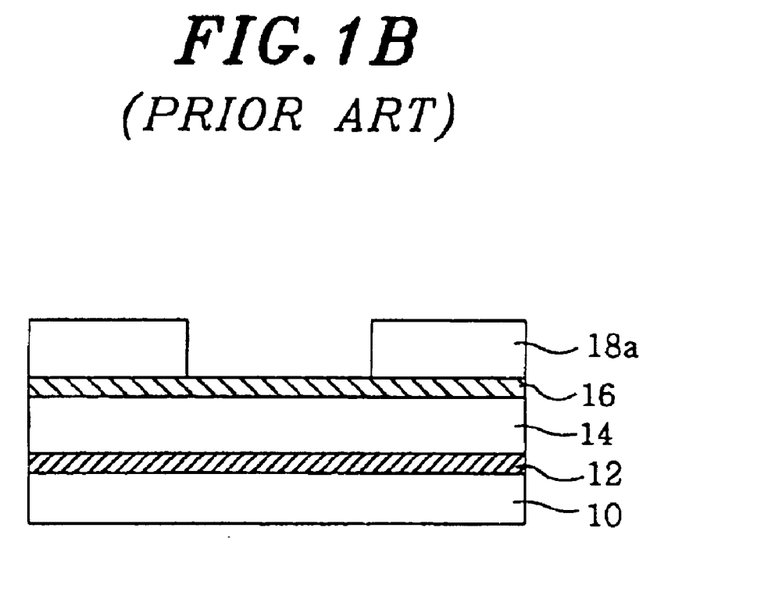

And, as shown in FIG. 1B, the second insulating layer 18, in turn, is etched down to the second etch stop layer 16 so that a trench 18a is formed and then the first photoresist pattern layer 20 is removed.

Figure 1C:
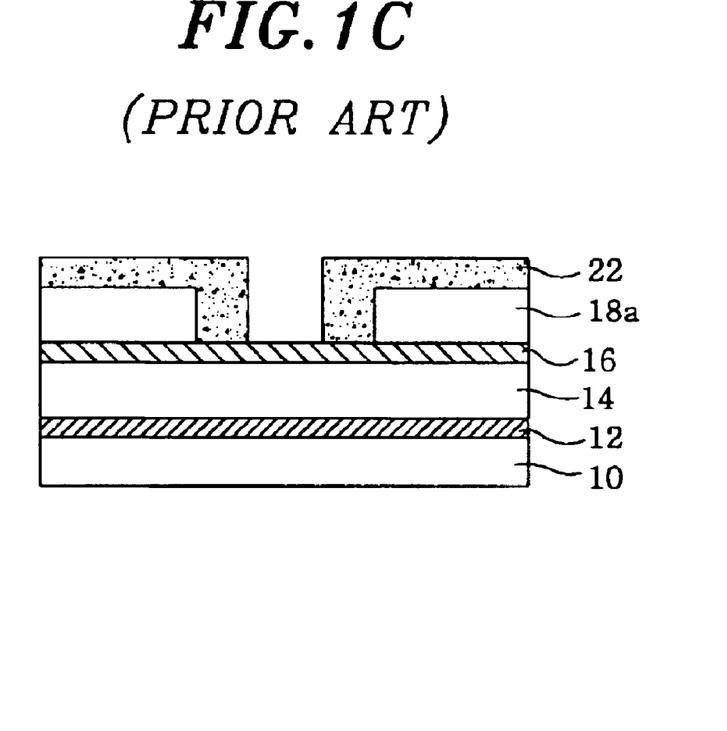

And then, as shown in FIG. 1C, a second photoresist layer 22 for defining a contact hole 24 is applied on the trench 18a.

Figure 1D:
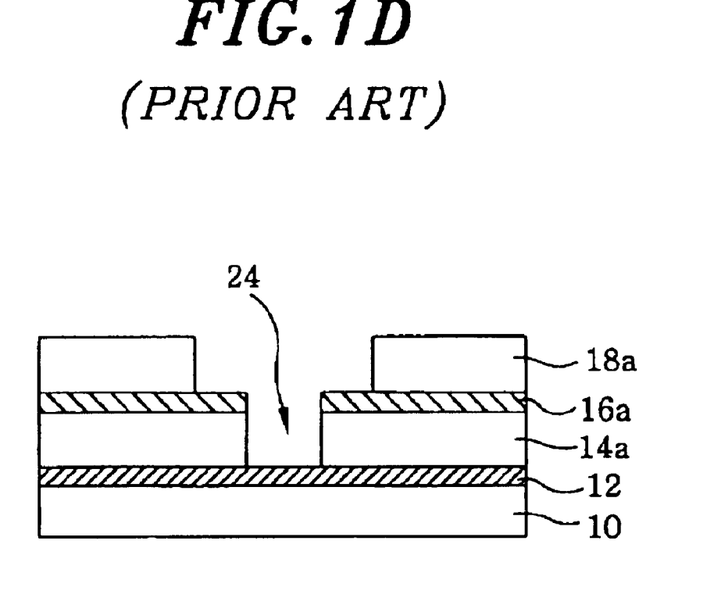

Thereafter, as shown in FIG. 1D, the second etch stop layer 16 and the first insulating layer 14 defined by the second photoresist pattern 22 is etched so that the contact hole 24 can be formed. In another embodiment, the first etch stop layer 12 may also be etched down to expose a portion of the semiconductor device, such as a wiring or an activated area, although it is not shown in FIG. 1D. Thereafter, the second photoresist pattern 22 is removed to complete a dual damascene structure.

Another conventional method for forming a dual damascene structure is presented in FIGS. 2A to 2D, in which a contact hole is first formed in an insulating layer and then a trench is formed.

Figure 2A:
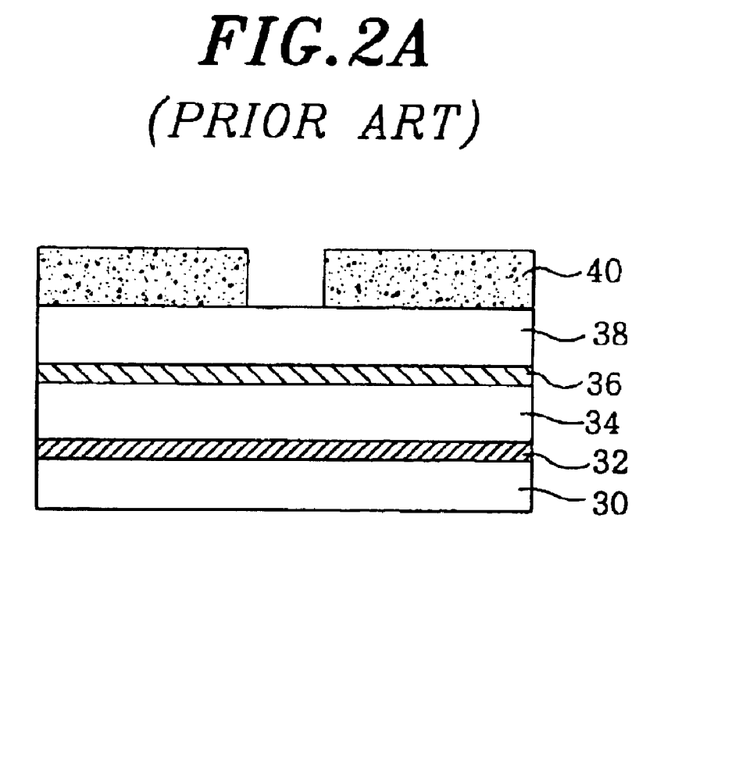
FIGS. 2A to 2D present a sequence of another conventional method for forming a dual damascene structure in a semiconductor device.

As described in FIG. 2A, a semiconductor substrate 30 is provided with a semiconductor device therein. Thereafter, a first etch stop layer 32 is applied on the semiconductor substrate 30. And then, a first insulating layer 34, a second etch stop layer 36 and a second insulating layer 38 are deposited on the first etch stop layer 32 sequentially. And then, a first photoresist pattern 40 for defining a contact hole is formed on the second insulating layer 38 by a photolithography process.

Figure 2B:
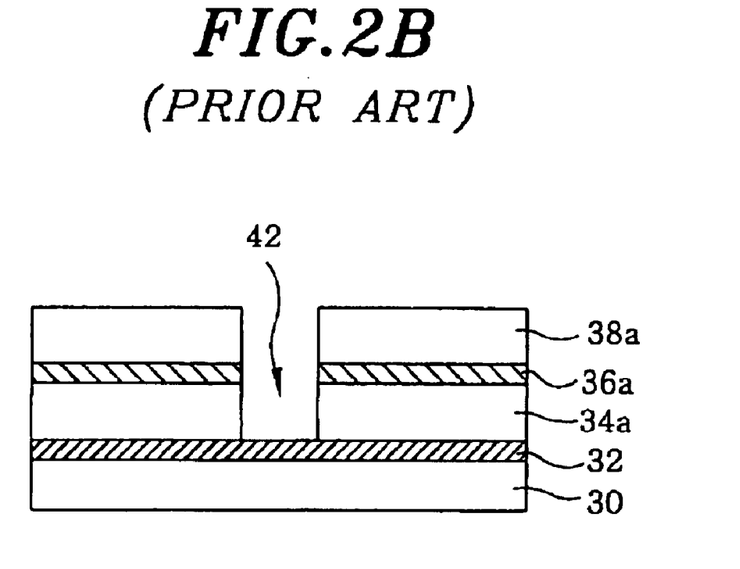

And, as shown in FIG. 2B, the second insulating layer 38, the second etch stop layer 36 and the first insulating layer 34 are etched down so that a contact hole 42 is formed. And then the first photoresist pattern layer 40 is removed. In another embodiment, though it is not shown in FIG. 2B, the contact hole 42 uncovering a portion of a semiconductor device may formed by etching the first etch stop layer 32.

Figure 2C:
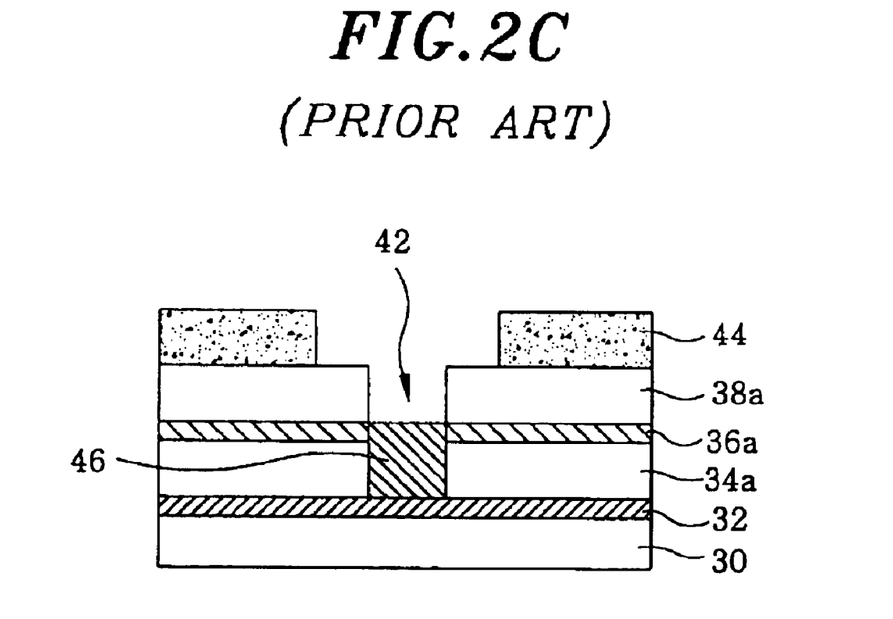

And then, as shown in FIG. 2C, a second photoresist layer 44 for defining a trench 48 is applied on the second insulating layer 38a. At this time, a gap filler 46 for filling the contact hole 42 up to the second etch stop layer 36a is formed in order to protect the semiconductor device when the second insulating layer 38a is etched.

Figure 2D:
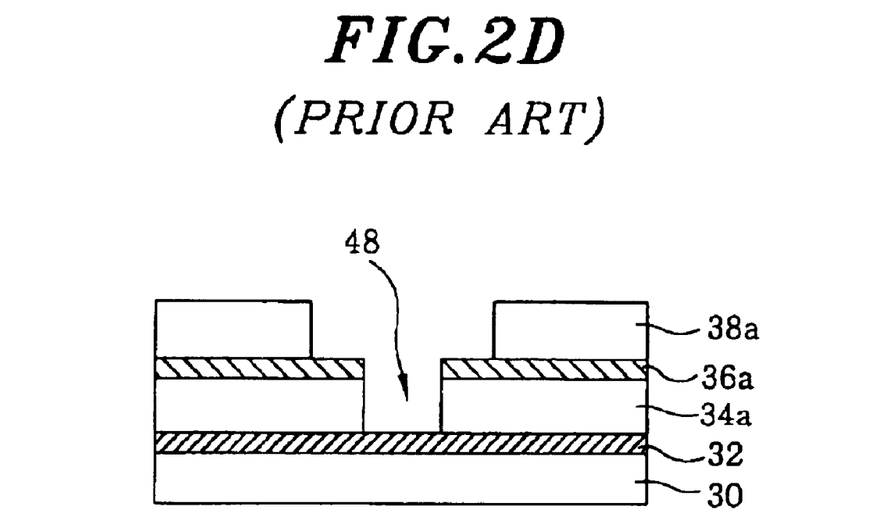

Thereafter, as shown in FIG. 2D, the second insulating layer 38a defined by the second photoresist pattern 44 is etched to form the trench 48 for wiring. Then, the second photoresist pattern 44 and the gap filler 46 are removed to complete the dual damascene structure.

Still another conventional method for forming a dual damascene structure is shown in FIGS. 3A to 3D. In this method, the dual damascene structure is formed by a way that a trench for wiring and a contact hole are formed by a self-aligned process.

Figure 3A:
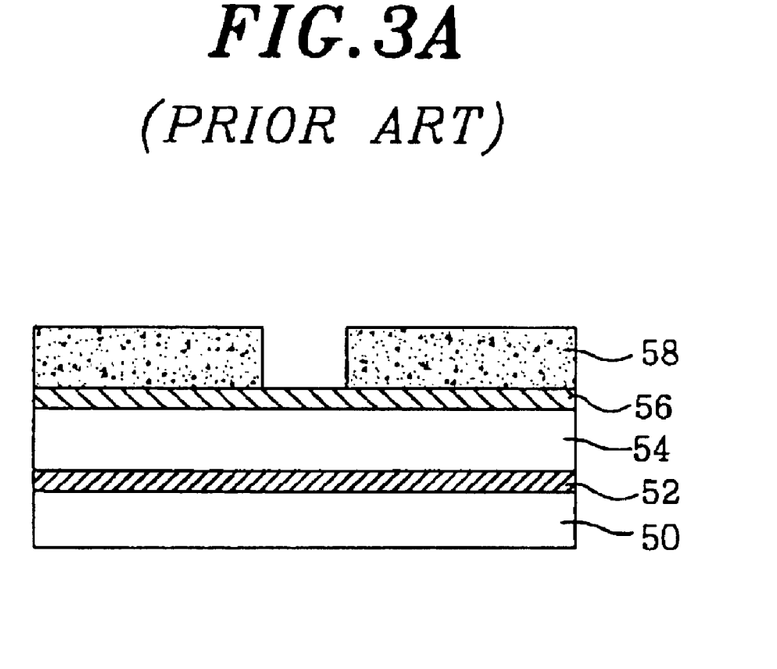
FIGS. 3A to 3D offer a sequence of still another conventional method for forming a dual damascene structure in a semiconductor device.

As described in FIG. 3A, a semiconductor substrate 50 is provided with a semiconductor device therein. Thereafter, a first etch stop layer 52 is applied on the semiconductor substrate 50. And then, a first insulating layer 54 and a second etch stop layer 56 are deposited on the first etch stop layer 52 sequentially. And then, a first photoresist pattern 58 for defining a contact hole is formed on the second etch stop layer 52 by a photolithography process.

Figure 3B:
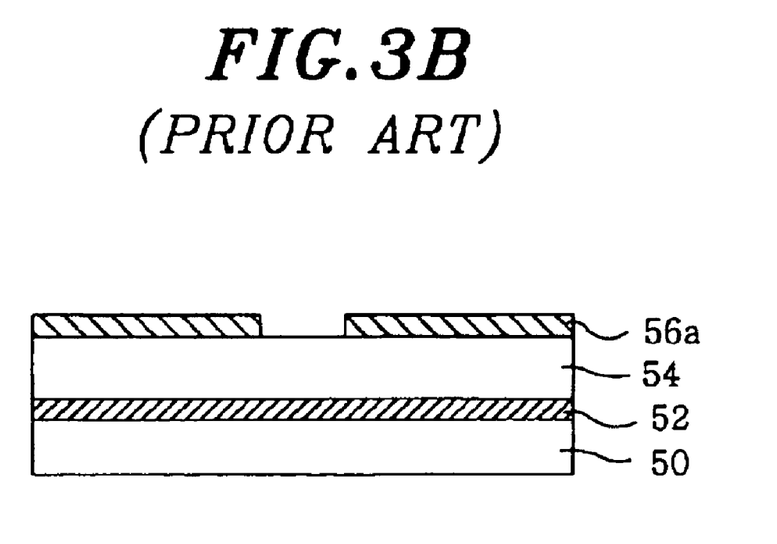

And, as shown in FIG. 3B, the second etch stop layer 56, in turn, is etched to form a patterned second etch stop layer 56a and then the first photoresist pattern layer 58 is removed.

Figure 3C:
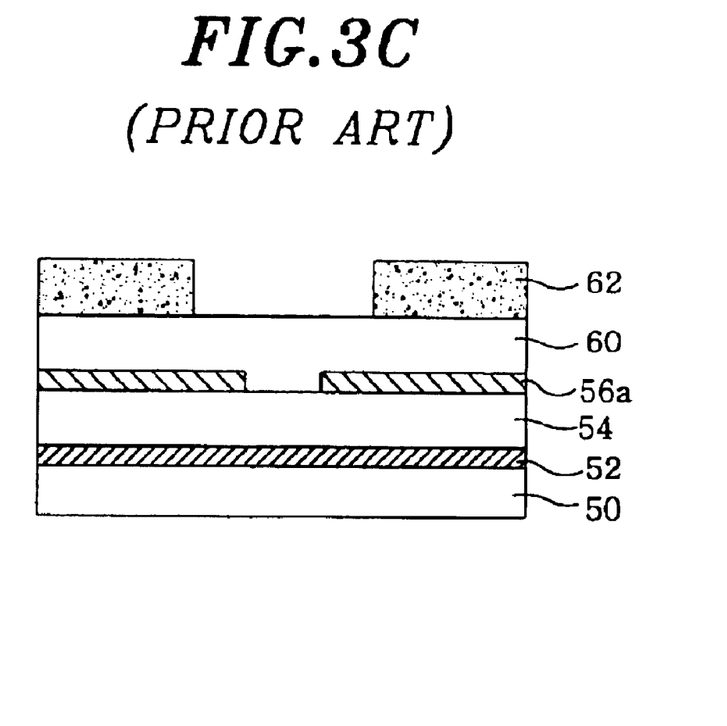

Sequentially, as shown in FIG. 3C, a second insulating layer 60 is applied on the structure of FIG. 3B and a second photoresist layer 62 for defining the trench for wiring is applied on the second insulating layer 60.

Figure 3D:
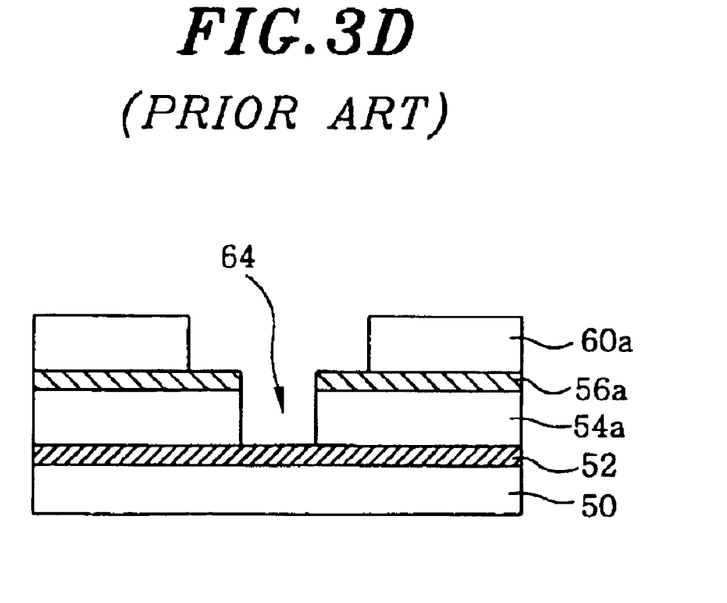

And then, as shown in FIG. 3D, the second insulating layer 60 defined by the second photoresist pattern 62 is etched and at the same time the first insulating layer 54 also is etched by using the patterned second etch stop layer 56a in a self-aligned way to form a dual damascene contact hole 64. Thereafter, the second photoresist pattern 62 is removed to complete the dual damascene structure. In another embodiment, though it is not shown in FIG. 3D, the first etch stop layer 52 may be etched so as for the underlying semiconductor device to be exposed.

Therefore, it is evident that the process is complicated, especially in that two photoresist processes must be used to form the trench and contact hole patterns. The multiplicity of the processes results in a lower productivity, and an increased cost.

SUMMARY OF THE INVENTION

It is, therefore, an object of the present invention to provide a method for forming a dual damascene structure in a semiconductor device by using single photolithography process and single etch stop layer.

In accordance with a preferred embodiment of the present invention, there is provided a method for forming a dual damascene structure in a semiconductor device, the method comprising the steps of: providing a substrate having a structure thereon; forming an insulating layer and an etch stop layer on the substrate sequentially; forming a first opening pattern for exposing a part of an upper surface of the etch stop layer by using a photolithography process; etching the etch stop layer by transferring the hole pattern into the etch stop layer; forming a first opening by etching the insulating layer down to a predetermined depth by transferring the hole pattern into the insulating layer; performing a pull back etching of an upper and side surface of the etch stop layer by a predetermined thickness for defining a second opening pattern; and forming a second opening and a third opening in the insulating layer by etching the etch stop layer and the insulating layer until the etch stop layer is removed, wherein the second opening and the third opening are etched by using the second opening pattern and the first opening as a mask, respectively.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENTS

The preferred embodiment of the present invention will now be described in detail with reference to the accompanying drawings.

FIGS. 4A to 4D show a method for forming a dual damascene structure in a semiconductor device in accordance with the present invention.

Figure 4A:
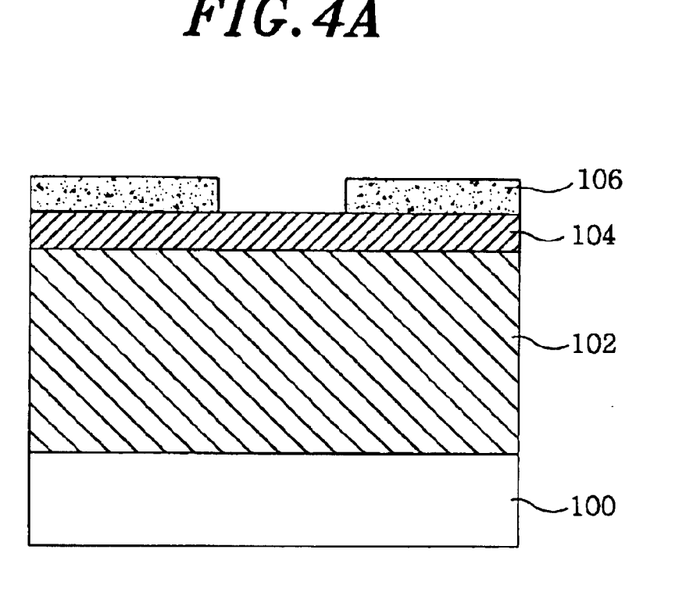
FIGS. 4A to 4D illustrate a sequence of a method for forming a dual damascene structure in a semiconductor device in accordance with the present invention.

A semiconductor substrate 100 in FIG. 4A is provided with metal layers for a semiconductor device therein. And then an insulating layer 102 is deposited preferably using silicon oxide on the semiconductor substrate 100, although it may alternatively be formed of another insulating material, for example BPSG (borophosphosilicate glass), USG (undoped silicate glass), or FSG(fluorinated silicate glass). It is preferred that the insulating layer 102 are deposited by plasma enhanced chemical vapor deposition or high-density plasma deposition and has a thickness of about 4000 to 8000 angstroms (Å).

Thereafter, an etch stop layer 104 containing such as silicon nitride (SiN) is applied on the insulating layer 102. Other etch stop materials such as an oxide, a nitride or a polysilicon are also suitable. A thickness of the etch stop layer 104 is determined by that of the insulating layer 102 to be etched in succeeding etching processes. It is preferred that silicon nitride is deposited using a low pressure chemical vapor deposition and that it has a thickness between about 500 to 2000 angstroms (Å).

Then, a photoresist pattern 106 is formed on the etch stop layer 104 to define a first opening pattern. And then, a part of the etch stop layer 104 is removed by using a etching performed in accordance with an etching recipe comprising Ar at a flow rate about 500 sccm, $O_2$ at about 10 sccm, and $CH_2F_2$ at about 20 sccm under a process pressure of about 150 mTorr, a source power of about 1000 W, and a temperature of about 20° C. so that a part of the insulating layer 102 is exposed. The etching process time is determined by the thickness of the etch stop layer 104. After the insulating layer 102 is exposed, the photoresist pattern 106 is removed.

Figure 4B:
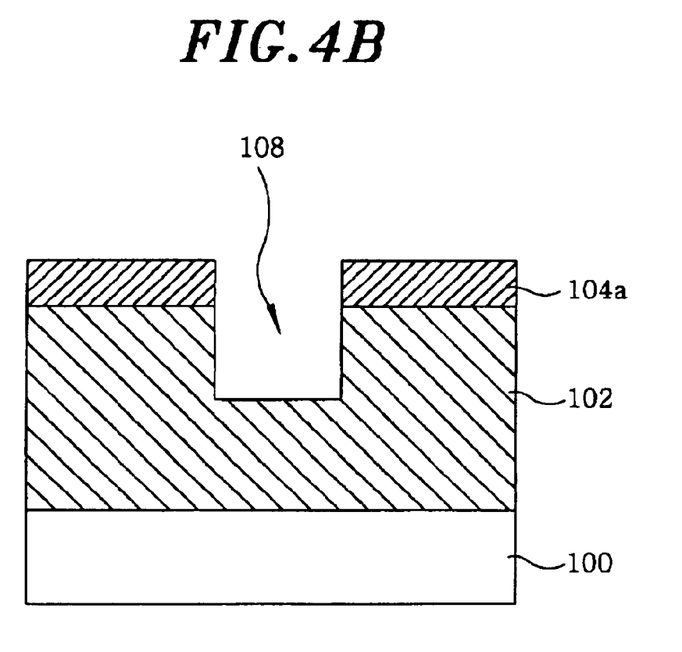

Sequentially, as shown in FIG. 4B, a first opening 108 is formed by a dry etching over the exposed insulating layer 102. Herein, the first opening 108 is formed to have a predetermined depth into the insulating layer 102 and the etching processing is controlled in order for the insulating layer 102 below the first opening 108 to have a enough thickness for succeeding etching processes. The depth of the first opening 108 into the insulating layer 102 is determined based on the thickness of the insulating layer 102. It is preferred that the first opening 108 is formed by using an oxide etching recipe comprising Ar at a flow rate about 380 sccm, $O_2$ at about 10 sccm, CO at about 300 sccm, and $C_4F_8$ at about 16 sccm under process pressure of about 55 mTorr, a source power of about 1700 W, and a temperature of about 20° C. The etching process time is determined by the thickness of the insulating layer to be etched.

Figure 4C:
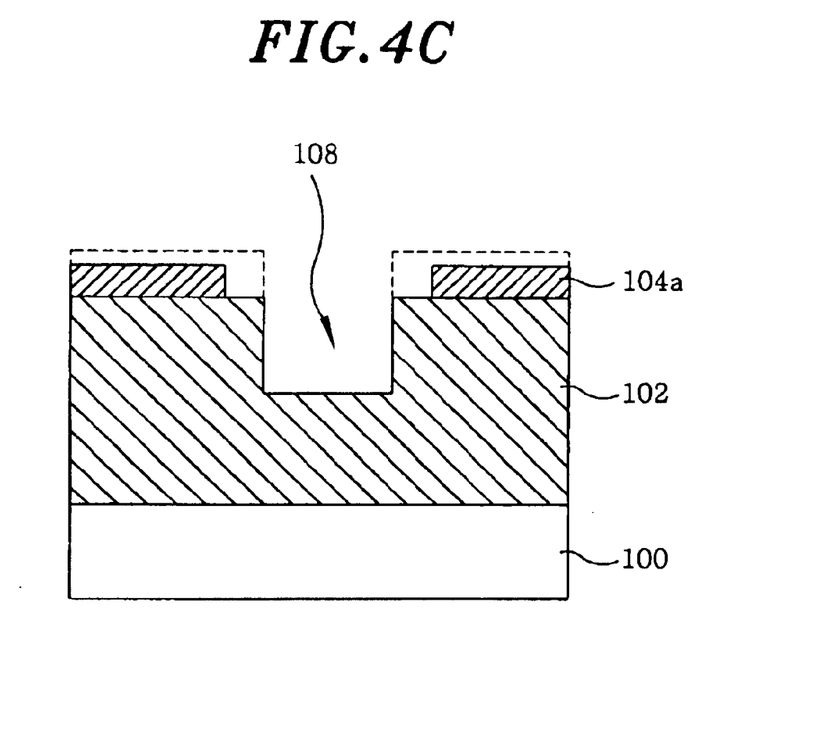

And then, as shown in FIG. 4C, the etch stop layer 104 is striped partially by a wet etching an upper and lateral surface thereof. Dot lines in FIG. 4C indicate a portion of the upper and lateral surface of the etch stop layer 104 which is removed by the wet etching. The wet etching is performed by using a pull back etching in the atmosphere of $H_3PO_4$ at temperature of about 160° C. The pull back etching is operated until the etch stop layer 104 is striped to expose a specific area of the insulating layer 102, wherein the specific area is corresponding to a place where a wiring for device is disposed. That is, the etched portion of the etch stop layer 104 is determined by a design rule for wiring to be constructed in a trench of the dual damascene structure.

Figure 4D:
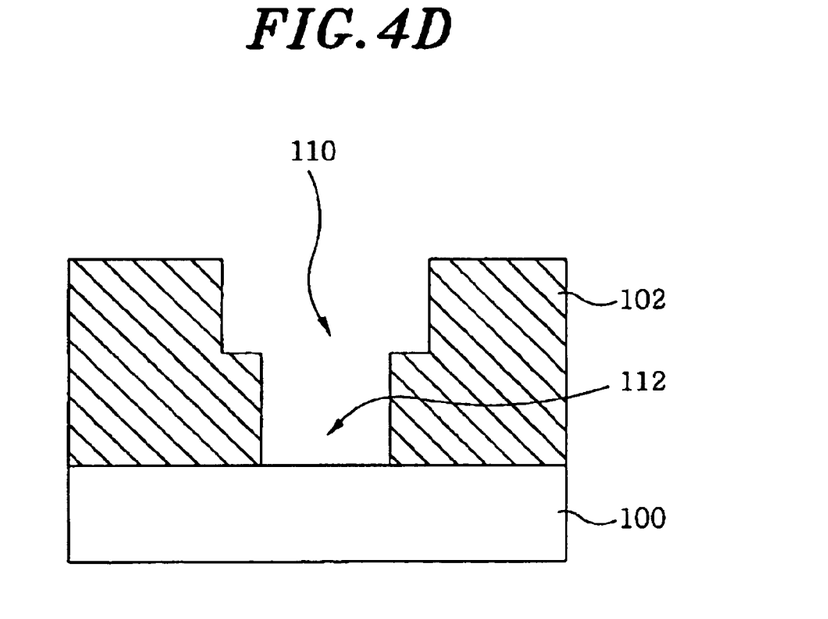

Thereafter, as shown in FIG. 4D, the rest etch stop layer 104a and the insulating layer 102 is etched by using the same etching recipe which has used for forming the first opening. Through this etching process, a side wall and a bottom area of the first opening 108 is etched to form a second opening 110 and third opening 112. That is, the rest etch stop layer 104a serves as a mask for the second opening 110 and the first opening 108 serves as a mask for the third opening 112. This etching proceeds until the rest etch stop layer 104a is removed on the upper surface of the insulating layer 102. Therefore, the second opening 110 is broader than the third opening 112 and the etch stop layer 104 is removed. That is, the upper surface of the insulating layer 102 serves as an end point for the etching and the insulating layer 102 is etched with the etch stop layer 104 at the same time.

Herein, the etching ratio between the etch stop layer and the insulating layer to be etched by the above oxide etching is about 1:10 to 1:30. The etching ratio may vary according to the material composing the etch stop layer and the insulating layer. For example, if the etch stop layer is composed of a nitride layer and the insulating layer is composed of an oxide layer, the etching ratio is about 1:20.

In this case, the rest etch stop layer 104a on the insulating layer 102 of 300 angstroms is enough to etch down the insulating layer 102 down to 6000 angstroms. As described above, the rest etch stop layer 104a serves as the end point of an etching.

The second opening 110 may be used for the contact hole whereby a wiring interconnections are disposed, and the third opening 112 may be used for the contact hole having a contact with the underlying metal layers.

Therefore, a dual damascene structure can be made by using single photoresist process and single etch stop layer so that a forming process for the dual damascene structure is simplified.

While the invention has been shown and described with respect to the preferred embodiments, it will be understood by those skilled in the art that various changes and modifications may be made without departing from the spirit and scope of the invention as defined in the following claims.

What is claimed is:

1. A method for forming a dual damascene structure in a semiconductor device, the method comprising the steps of:

providing a substrate having a structure thereon;

forming an insulating layer and an etch stop layer on the substrate sequentially;

forming a first opening pattern for exposing a part of an upper surface of the etch stop layer by using a photolithography process;

etching the etch stop layer by transferring the first opening pattern into the etch stop layer;

forming a first opening by etching the insulating layer down to a predetermined depth by transferring the first opening pattern into the insulating layer;

performing a pull back etching of an upper and side surface of the etch stop layer by a predetermined thickness for defining a second opening pattern; and forming a second opening and a third opening in the insulating layer by etching the etch stop layer and the insulating layer until the etch stop layer is removed, wherein the second opening and the third opening are etched by using the second opening pattern and the first opening as a mask, respectively.

2. The method of claim 1, wherein the etch stop layer contains an oxide, a nitride, or a polysilicon.

3. The method of claim 1, wherein a thickness of the etch stop layer is about 500 to 2000 angstroms (Å).

4. The method of claim 1, wherein a thickness of the etch stop layer to be etched during the pull back etching is determined by a design rule of wiring.

5. The method of claim 1, wherein the pull back etching is operated by a wet etching.

* * * * *